(12) United States Patent
Trucco

(10) Patent No.: US 6,871,776 B2
(45) Date of Patent: Mar. 29, 2005

(54) MANUFACTURE OF SOLID-SOLDER-DEPOSIT PCB UTILIZING ELECTRICALLY HEATED WIRE MESH

(76) Inventor: Horacio Andrés Trucco, 25 Nursery Rd., Melville, NY (US) 11747-1028

( * ) Notice: Subject to any disclaimer, the term of this patent is extended or adjusted under 35 U.S.C. 154(b) by 81 days.

(21) Appl. No.: 10/385,222

(22) Filed: Mar. 10, 2003

(65) Prior Publication Data

US 2004/0178251 A1 Sep. 16, 2004

(51) Int. Cl.[7] .......................... B23K 31/00; B23K 31/02
(52) U.S. Cl. ............................... 228/234.1; 228/248.1; 228/245
(58) Field of Search ................... 228/180.22, 234.1, 228/248.1, 258, 262, 33, 39, 43, 245

(56) References Cited

U.S. PATENT DOCUMENTS

| | | | | |
|---|---|---|---|---|
| 4,260,675 A | * | 4/1981 | Sullivan | 430/315 |
| 5,407,488 A | * | 4/1995 | Ray | 134/6 |
| 5,934,545 A | * | 8/1999 | Gordon | 228/191 |
| 6,371,017 B1 | * | 4/2002 | Yamazaki et al. | 101/129 |
| 6,548,790 B1 | * | 4/2003 | Trucco | 219/605 |
| 2001/0052536 A1 | * | 12/2001 | Scherdorf et al. | 228/220 |

FOREIGN PATENT DOCUMENTS

JP        06-320706 A    * 11/1994

* cited by examiner

*Primary Examiner*—L. Edmondson

(57) ABSTRACT

A process and apparatus for manufacturing Solid Solder Deposit-Printed Circuit Board (SSD-PCB) by melting dry solder powder previously deposited on a pocketed-PCB 20. The process and apparatus utilize as heat source an electrically heated conveyor wire mesh 76 instead of a reflow oven. This invention, unlike the prior art for producing SSD-PCB, can readily utilize dry solder powder in conjunction with flux layers 116 separately deposited on top of the conveyor wire mesh 76 thereby excluding the use of solder paste and associated paste printing equipment. Specifically the invention reduces the manufacturing cost because: shortens manufacturing time, reduces manufacturing energy consumption and requires less manufacturing equipment than prior art.

28 Claims, 8 Drawing Sheets

Comparison of Invention to Prior Art

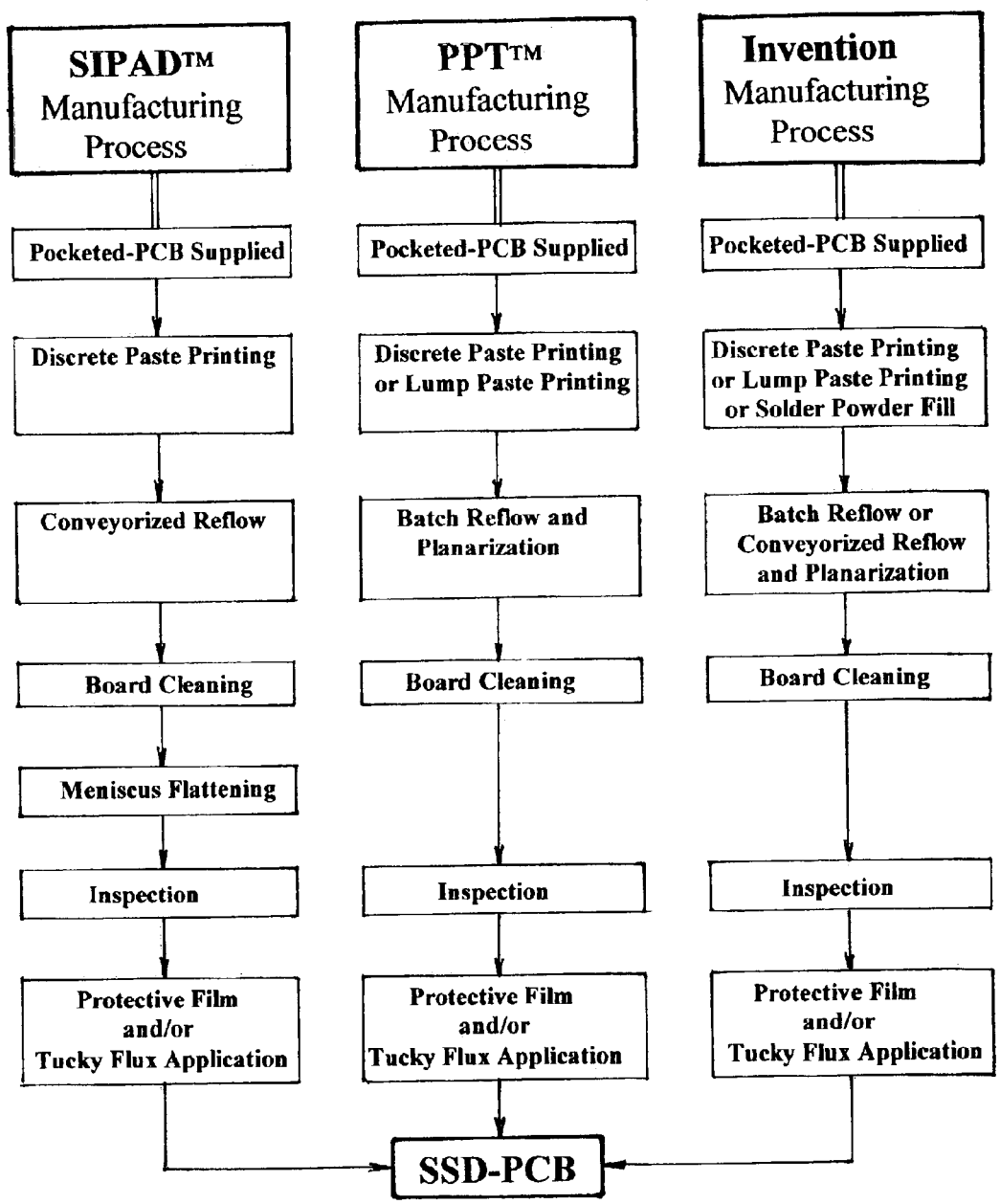
Fig. 1 Comparison of Invention to Prior Art

|  | SIPAD™ Manufacturing Process | PPT™ Manufacturing Process | Invention Manufacturing Process |
|---|---|---|---|
| Solder Supply | Discrete Printing | Discrete Printing or Lump Printing | Discrete Printing or Lump Printing or Solder Powder |
| Process Mode | Conveyorized | Batch | Batch and Conveyorized |
| Heat Source | Conventional Reflow Oven | Special Reflow Oven | Electrically Heated Wire Mesh |
| Heating Severity | Harsh<br>1 to 3 minutes | Mild<br>15 seconds | Milder<br>5 seconds |
| Meniscus Flattening | Required | None | None |
| Drawbacks | (1) Costly Equipment<br>(2) Harsh Heating<br>(3) Flattening | (1) Batch Mode<br>(2) Don't Accept Solder Powder | None |
| Advatages | None | (1) Lump Printing<br>(2) Mild Reflow | (1) Lump Printing<br>(2) Milder Reflow<br>(3) Solder Powder<br>(4) No Reflow Oven<br>(5) No Printer |

Fig. 2  Features and Advantages of Invention over Prior Art

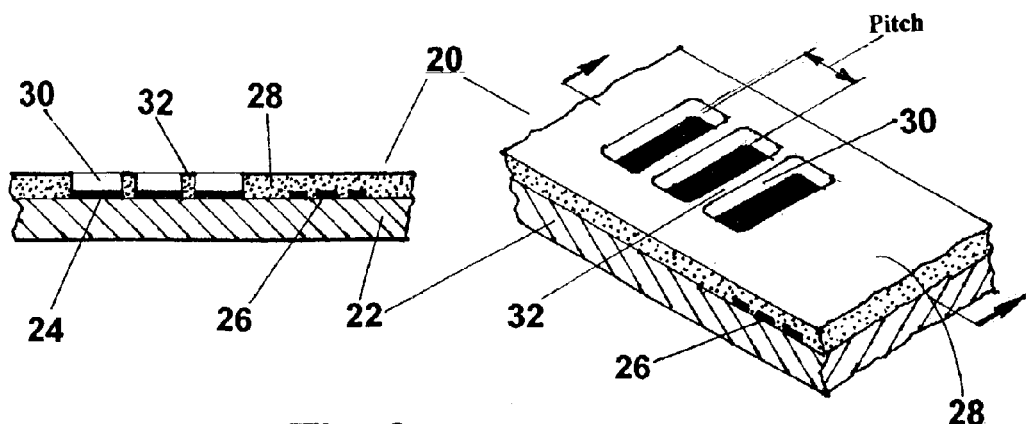
Fig. 3 Pocketed-PCB Details
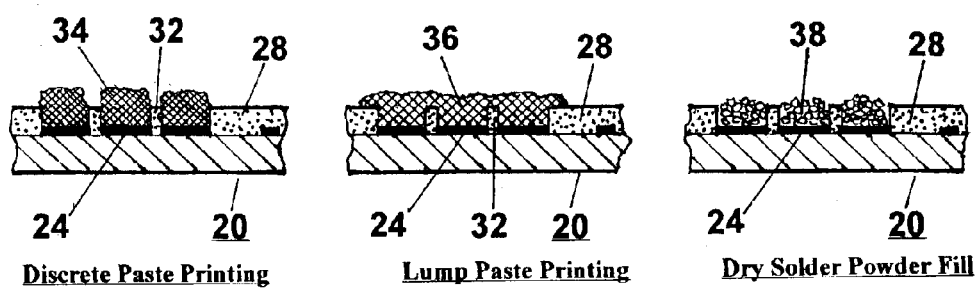
Discrete Paste Printing　　　Lump Paste Printing　　　Dry Solder Powder Fill
Fig. 4 Manners for Supplying Solder to a Pocketed-PCB
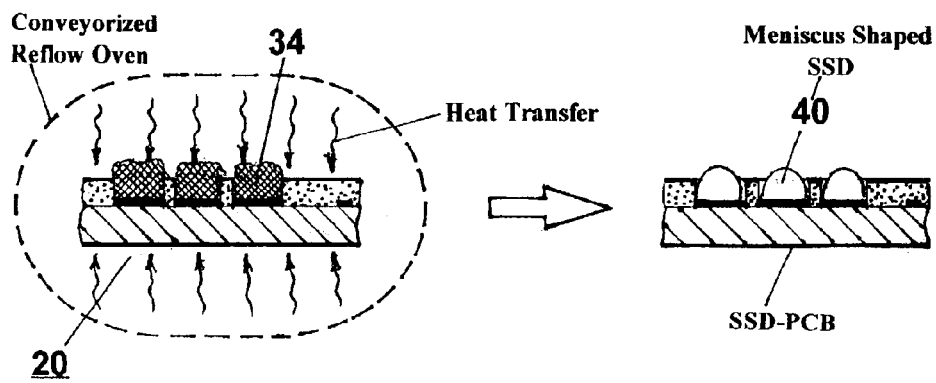
Fig. 5 SIPAD® Reflow Approach

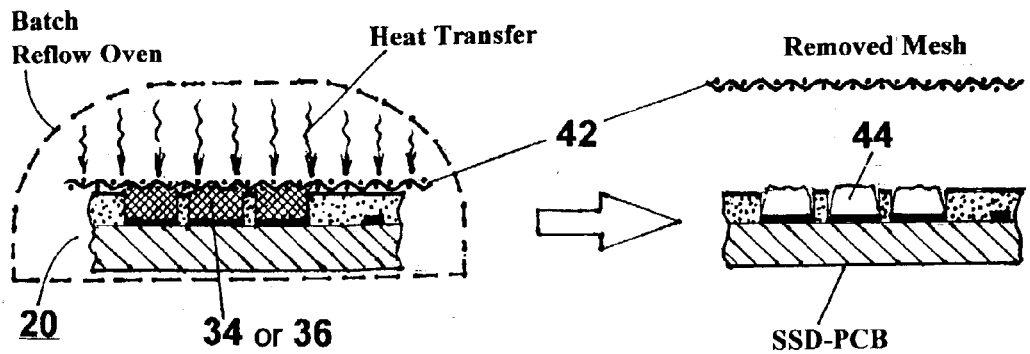
Fig. 6 PPT® Reflow Approach
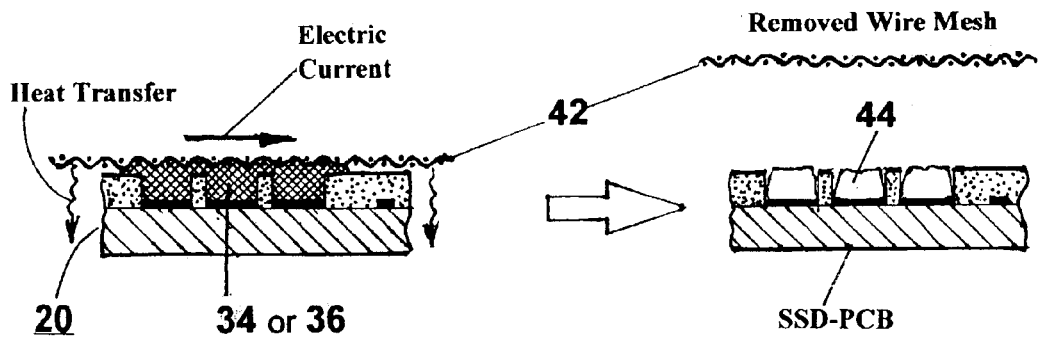
Fig. 7 Invention Reflow Approach Utilizing Solder Paste
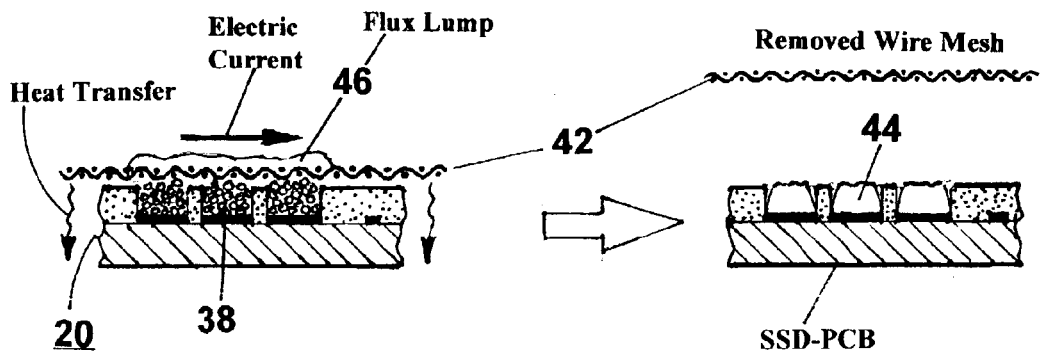
Fig. 8 Invention Reflow Approach Utilizing Solder Powder

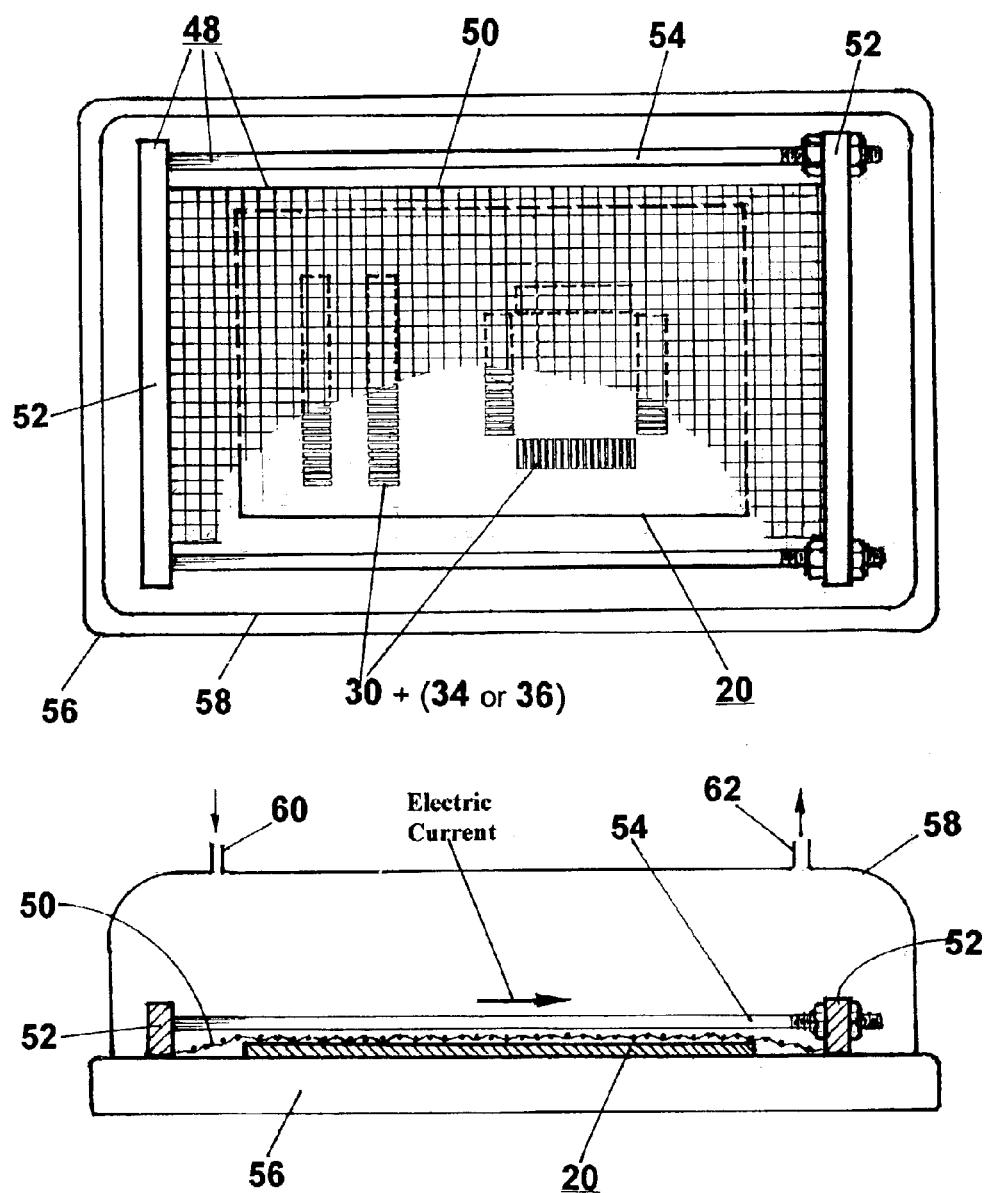
Fig. 9 Batch Manufacturing SSD-PCB Utilizing Solder Paste

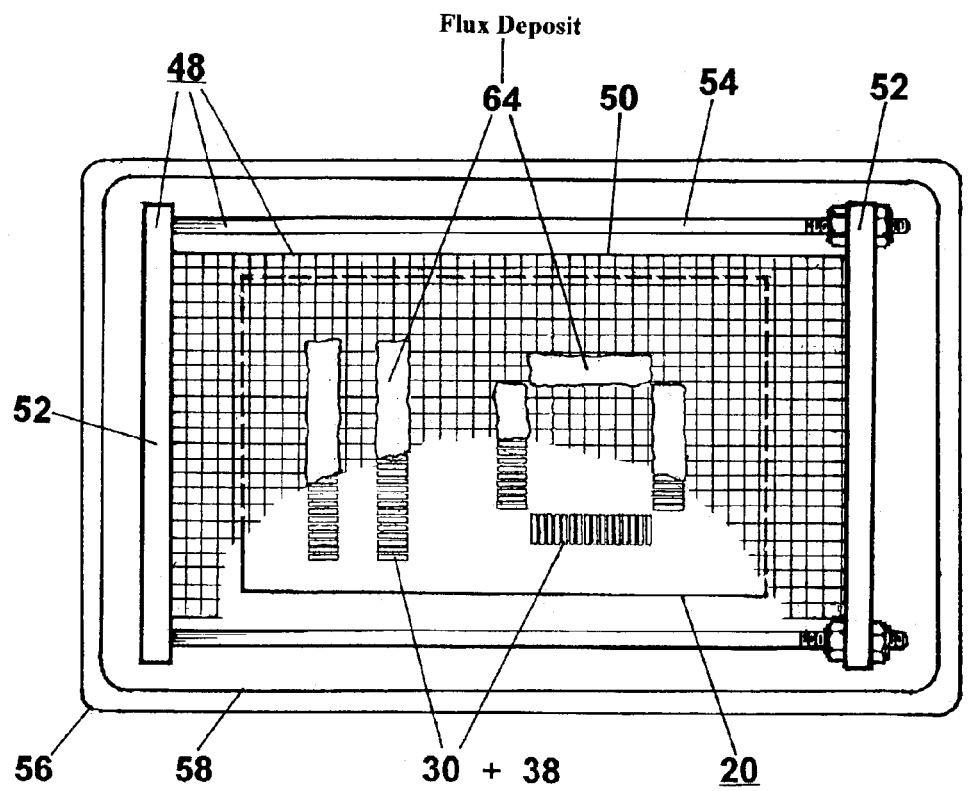
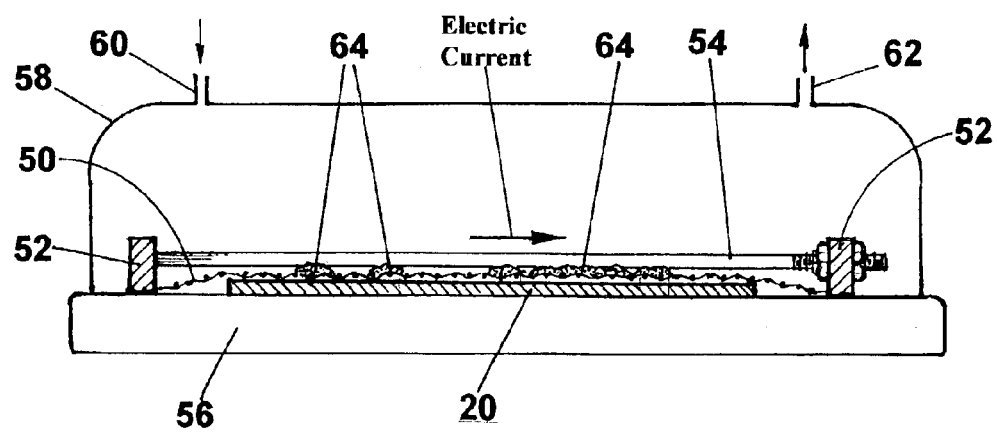
Fig. 10 Batch Manufacturing SSD-PCB Utilizing Solder Powder

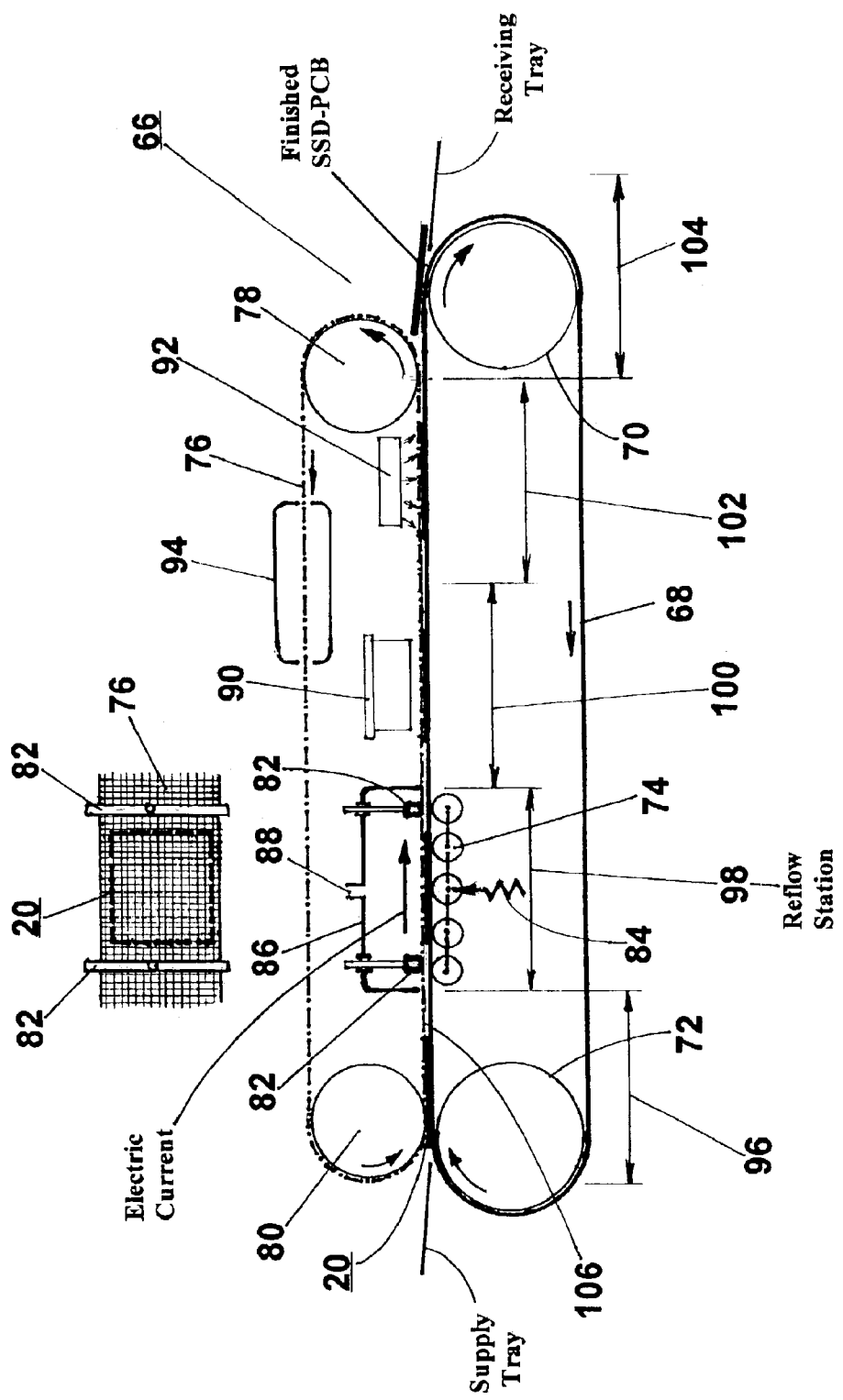
Fig. 11 Conveyorized Manufacturing SSD-PCB Utilizing Solder Paste

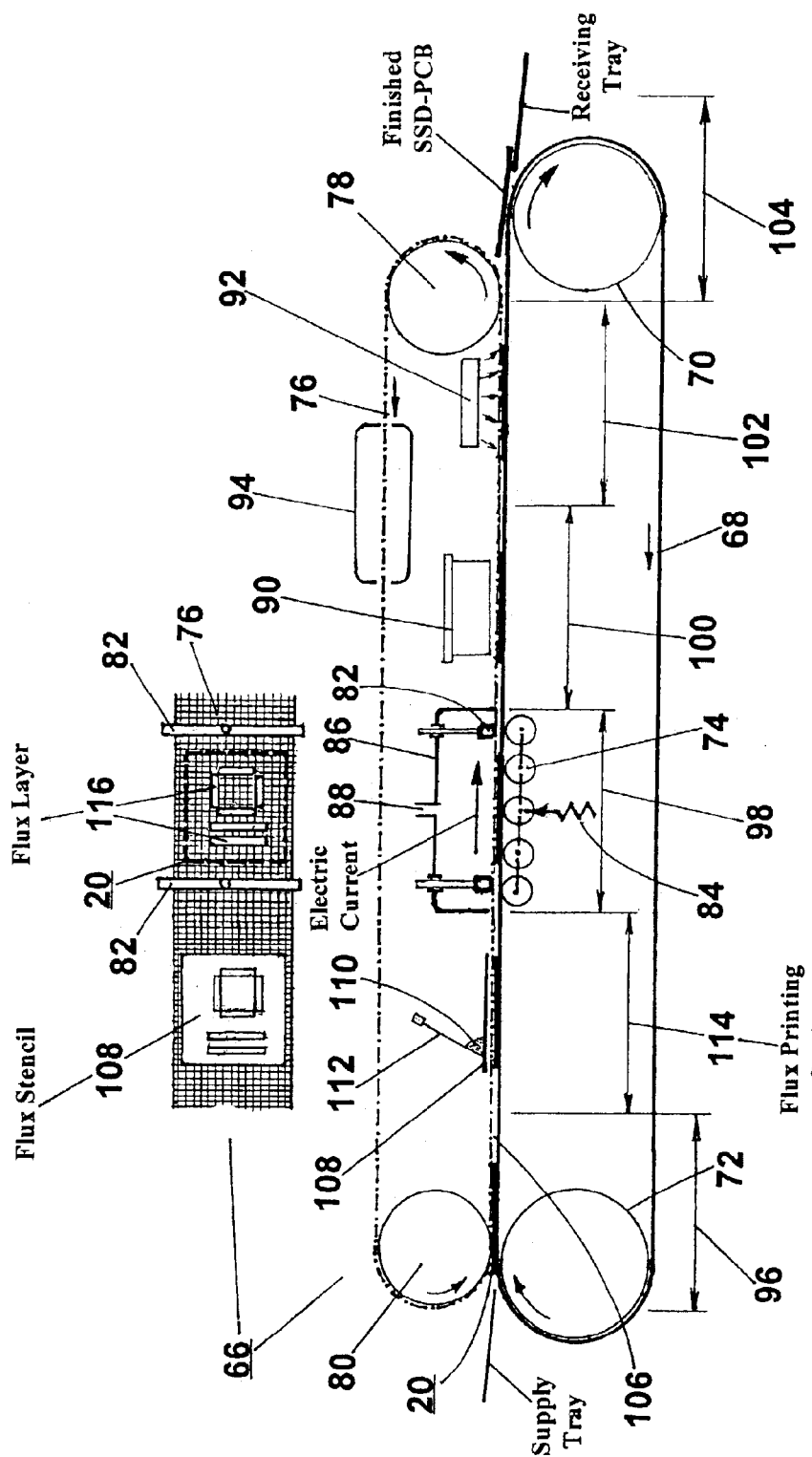
Fig. 12 Conveyorized Manufacturing SSD-PCB Utilizing Dry Solder Powder

MANUFACTURE OF SOLID-SOLDER-DEPOSIT PCB UTILIZING ELECTRICALLY HEATED WIRE MESH

FIELD OF INVENTION

This invention relates to a novel and improved process and apparatus for manufacturing solid solder deposit-printed circuit board (SSD-PCB) utilizing as heat source an electrically heated wire mesh in place of a reflow oven.

BACKGROUND-DESCRIPTION OF THE PRIOR ART

Solid Solder Deposit (SSD) refers to a relatively thick layer of solid solder metallurgically bonded over the soldering pads, lands or contacts, of a bare-PCB. Bare-PCB refers to a conventional PCB that would require deposition of solder paste prior to components placements for a subsequent reflow soldering operation.

Solid Solder Deposit-Printed Circuit Board (SSD-PCB) refers to a PCB with its soldering pads covered by SSDs. Therefore, a SSD-PCB provides by itself, in solid form, adequate amounts of solder fused to its soldering pads, for reflow soldering components on it.

SSD-PCB technology allows to eliminate defects such as shorts, solder balls and open joints when reflowing PCB-assemblies populated by fine pitch devices. Said devices or components are characterized by spacing between its terminals, or contacts, of less than 0.5 mm.

SSD-PCBs can be optically and electrically inspected before they are accepted for components placement. Therefore, with this technology it is customary to obtain a 100% first-pass yield due to the absence of above cited defects. Those defects are difficult to eradicate when utilizing the conventional paste-printed PCB assembly method. Furthermore, those defects demand costly rework and/or repair.

Since SSD-PCB is an emerging technology it is still relatively more costly than the conventional paste-printed PCB approach for assembling electronics components. Application of SSD-PCB is cost competitive when assembling boards populated by components which solder joints, or terminals, exhibit ultra-fine pitch spacing (herein defined as about 0.3 mm). In lieu of this fact, this invention aims at reducing the overall cost of manufacturing SSD-PCBs, in doing so the SSD-PCB technology would become more competitive than now with respect to the paste-printed PCB approach for assembling electronics components.

The most recent and relevant prior art for producing SSD-PCB is covered by the following ten patents and two pending patent applications;

(1) U.S. patent application Publication No. US 2002/0148881 A1 Process for Manufacturing Solid-Solder-Deposit Printed Circuit Boards published Oct. 17, 2002, (2) U.S. patent application Publication No. US 2002/0113324 A1 Method for Forming Three-Dimensional Circuitization and Circuits Formed published Aug. 22, 2002, (3) U.S. Pat. No. 6,158,650 Process for Fine and Coarse Pitch Solder Deposits on Printed Circuit Boards issued Dec. 12, 2000 (PPT™ commercial process), (4) U.S. Pat. No. 5,984,166 Process for Creating Fine and Coarse Pitch Solder Deposits on Printed Circuit Boards issued Nov. 26, 1999 (PPT™ commercial process), (5) U.S. Pat. No. 5,492,266 Fine Pitch Solder Deposits on Printed Circuit Boards Process and Product issued Feb. 30, 1996, (6) U.S. Pat. No. 5,443,671 Product for Surface Mount Solder Joints issued Apr. 4, 1995 (PPT™ commercial process), (7) U.S. Pat. No. 5,395,044 Apparatus for Forming Surface Mount Solder Joints issued Mar. 7, 1995 (PPT™ commercial process), (8) U.S. Pat. No. 5,315,070 Printed wiring board to which solder has been applied issued May 24, 1994, (SIPAD™ commercial process), (9) U.S. Pat. No. 5,310,574 Method for Surface Mount Solder Joints issued May 20, 1994 (PPT™ commercial process),

(20) U.S. Pat. No. 5,271,548 Method for applying solder to and mounting components on printed circuit boards issued Dec. 21, 1993 (SIPAD™ commercial process),

(11) U.S. Pat. No. 5,172,853 Method for applying solder to printed circuit boards and printed wiring board to which solder has been applied issued Dec. 22, 1993, and

(22) U.S. Pat. No. 5,051,339 Method and Apparatus for Applying Solder to Printed Wiring Boards by Immersion issued Sep. 24, 1991 (Optipad™ commercial process).

When this inventor recognized that the presently available commercial technology for manufacturing SSD-PCBs, can and needs to be improved, the objectives and purposes of this invention were inspired, leading him to the conception and accomplishment of this invention.

OBJECTIVES AND ADVANTAGES OF THE INVENTION

The general objective of this invention is to provide the electronics manufacturing or electronics packaging industry with a new, improved, safe, reliable, useful and, above all, a more economical process and apparatus for producing SSD-PCB. Utilization of my invention will: (1) improve SSD-PCB reliability since during manufacture a less severe heating cycle is utilized, (2) require fewer manufacturing equipment, specifically neither reflow oven nor paste printer need to be employed, and (3) reduce the present cost for manufacturing SSD-PCBs. Further objectives and advantages of this invention will become apparent from a consideration of the drawings and following description.

BRIEF DESCRIPTION OF THE DRAWING FIGURES

FIG. 1 compares the steps necessary for manufacturing SSD-PCB according to this invention to the steps utilized by two commercially-successful prior art, namely the SIPAD™ and PPT™ processes. Three side-by-side flow diagrams are depicted with identifying headings.

FIG. 2 presents in tabular format the most relevant features and advantages of this invention and compares them to the SIPAD™ and PPT™ processes.

FIG. 3 shows, in cross-sectional side view and perspective view, a portion of a pocketed-PCB, the initial component required by this invention and by the SIPAD™ and PPT™ processes for manufacturing SSD-PCB.

FIG. 4 shows three alternative manners for supplying solder to a pocketed-PCB.

FIG. 5 shows the reflow phase utilized by the SIPAD™ process and the outcome.

FIG. 6 shows the reflow phase utilized by the PPT™ process and the outcome.

FIG. 7 shows one of the two reflow phases utilized by this invention and the outcome.

FIG. 8 shows the second reflow phase utilized by this invention and the outcome.

FIG. 9 shows, in top view and cross-sectional side view, an apparatus that represents the simplest embodiment according to this invention. It permits to manufacture SSD-PCB in a batch mode.

FIG. 10 shows, in top view and cross-sectional side view, a variation of the apparatus of FIG. 9. This embodiment permits to manufacture SSD-PCB in a batch mode utilizing dry solder powder instead of solder paste.

FIG. 11 shows, in side view and in incomplete top view, an apparatus that represents the basic conveyorized embodiment according to the invention. It permits to manufacture SSD-PCB in a conveyorized mode.

FIG. 12 shows, in side view and in incomplete top view, an enhanced modification of the apparatus shown in FIG. 11. This embodiment permits to manufacture SSD-PCB in a conveyorized mode utilizing dry solder powder instead of solder paste.

REFERENCE NUMERALS IN DRAWINGS

Underlined numerals designate either an assembly or a group of parts. Notes in parentheses help to identify to which assembly the preceding part belongs, the working or function of the preceding part or the relationship of the preceding part to a method or process.

The parts cited in the following description are;
20 pocketed-PCB,
22 dielectric substrate (part of pocketed-PCB 20),
24 soldering pad (part of pocketed-PCB 20),
26 interconnecting trace (part of pocketed-PCB 20),
28 solder mask (part of pocketed-PCB 20),
30 pocket (window or cavity into solder mask 28 exposing a pad 24),
32 barrier (web or partition between adjacent pads 24),
34 solder paste volume (result of discrete solder paste printing a pocket 30),
36 solder paste lump (result of lump solder paste printing a group of pockets 30),
38 solder powder pile (result of filling a pocket 30 with dry solder powder),
40 meniscus shaped SSD (result of the SIPAD™ reflow process),
42 wire mesh,
44 flat-shaped SSD (result of the PPT™ and of this invention reflow processes),
46 flux lump (result of printing flux over wire mesh 42),
48 mesh assembly,
50 tightened wire mesh (part of mesh assembly 48),
52 mesh end anchor (part of mesh assembly 48),
54 link rod (part of mesh assembly 48),
56 workholder,
58 enclosure chamber,
60 inlet means,
62 outlet means,
64 flux deposit (placed on top of tightened wire mesh 50)
66 twin-conveyor system,
68 conveyor belt (part of twin-conveyor system 66),
70 driver drum (drives conveyor belt 68),
72 driven drum (supports and guides conveyor belt 68),
74 set of idle rollers (provides vertical support for conveyor belt 68)
76 conveyor wire mesh (part of twin-conveyor system 66),
78 driver spool (drives conveyor wire mesh 76),
80 driven spool (supports and guides conveyor wire mesh 76),
82 wire mesh electrode,
84 vibration inducer (acts on set of idle rollers 74),
86 fumes hood,
88 inlet/outlet means,
90 mesh scraping means,
92 mesh cooling means,
94 mesh cleaning device,
96 board capture station,
98 reflow station,
100 solder removal station,
102 mesh cooling station,
104 board ejection station,
106 narrow moving passage (constant gap between belt 68 and wire mesh 76),
108 flux stencil,
110 flux supply volume,
112 doctor blade,
114 flux printing station, and
116 flux layer (placed on top of conveyor wire mesh 76).

Glossary of Acronyms

All through the specification, the abstract, the appended claims and figures some or all of the following acronyms are used;
DPP (discrete paste printing),
DSPF (dry solder powder fill),
LPP (lump paste printing),
PCB (printed circuit board),
SSD (solid solder deposit) and
SSD-PCB (solid solder deposit-printed circuit board).

SUMMARY OF THE INVENTION

This invention discloses a novel process and apparatus for manufacturing SSD-PCB utilizing as heat source an electrically heated fine wire mesh instead of a reflow oven as the prior art does. Specifically my invention reduces the cost of manufacturing SSD-PCB, improves SSD-PCB quality while requiring fewer manufacturing equipment when compared to the commercially-successful prior art. As a result, electronic products assembled around SSD-PCBs that would be manufactured according to this invention should become of better quality and more reliable and its overall manufacturing cost reduced.

The manufacture of SSD-PCBs according to the SIPAD™ prior art, see FIG. 1 left side column, requires that solder paste be precisely deposited over each soldering pad of a pocketed-PCB 20 by an advanced paste printing process. Subsequently the paste printed over said pocketed-PCB 20 is melted inside a conventional reflow oven. As result, a relatively thick layer of SSD (hump or meniscus shaped) is formed over each soldering pad of said pocketed-PCB 20. After the board is cleaned and the hump shaped SSDs are pressed flat by a flattening procedure, the board is ready to accept placement of all the electronic components required for a final reflow operation.

In the manufacture of SSD-PCBs according to the PPT™ pior art, see FIG. 1 central column, solder paste could either (a) be precisely deposited over each soldering pad of a pocketed-PCB 20 (as required by the SIPAD™ case) or, (b)

be lump printed (solder paste simultaneously overlapping a few adjacent soldering pads). Subsequently the paste printed side of said pocketed-PCB 20 is covered with a fine mesh, then the free face of said mesh is subjected to a stream of hot air inside a special reflow oven resulting in already flat SSDs.

The PPT™ process exhibits advantages beyond the SIPAD™ process because it allows to utilize cheap non-precision paste printing equipment (lump printing), does not need flattening and exposes the PCB to a less harsh heating cycle during reflow. However, it can only be implemented as a batch process, a disadvantage over the conveyorized SIPAD™ process.

Consequently, until now, both above cited commercially-successful processes exhibit undesirable drawbacks that in fact translate into relatively costly SSD-PCBs. As result of economical considerations, utilization of the SSD-PCB technology by the electronics assembly industry is now limited to PCBs populated by ultra-fine pitch devices, an application where the conventional paste-printed PCB produce large number of defects that requires repair and/or rework.

My invention circumvents all the drawbacks that characterize both above cited commercially-successful processes for manufacturing SSD-PCB, see FIG. 1 right side column. In addition it enhances the present SSD-PCB technology by allowing to eliminate; (a) the paste printing process (when utilizing dry solder powder) and (b) the conventional reflow oven that is replaced by a simple electrically heated wire mesh.

The table in FIG. 2 presents relevant features and disadvantages of the two commercially-successful prior art and acquaints the reader on the overall features and advantages offered by this invention with respect to the prior art.

Summarizing my invention allows to eliminate two relatively costly equipment until now "required" to fabricate SSD-PCBs, namely the paste printer and the reflow oven. My invention only requires one single apparatus, or single platform, in order to transform a pocketed-PCB 20 into a SSD-PCB.

The reader should be aware that within the prior art for manufacturing SSD-PCBs there are other processes not mentioned above because they have not proven commercially successful, among them we find plating methods for depositing solder over pads, injecting molten solder alloy over pads through a mask, the Optipad™ commercial process, etcetera.

Invention Fundamentals

Now, aided by FIG. 3 through FIG. 8, I shall illustrate and describe specific requirements, features and attained results that characterize and distinguish this invention from the two commercially-successful prior art mentioned above. This information shall later on permit the reader to better comprehend the novel and non-obvious solutions for manufacturing SSD-PCB disclosed by this invention. The preferred embodiments are illustrated in FIG. 9 through FIG. 12 and will be described in the next part of this specification.

FIG. 3 shows, in cross-sectional side view and in perspective view, a portion of a pocketed-PCB 20 comprising a dielectric substrate 22, a plurality of soldering pads 24, a plurality of interconnecting traces 26 and a solder mask 28. Solder mask 28 fills in-between and around all the pads 24 leaving them uncovered meanwhile covering all interconnecting traces 26. Consequently, solder mask 28 covers the entire face of pocketed-PCB 20 except for pockets 30 that intentionally expose all soldering pads 24.

The cutout of each pocket 30 approximately match the footprint of the corresponding soldering pad 24. In fact pocket 30 acts as a cavity, or mold, where a SSD will be formed during reflow. Adjacent pads 24 are physically separated by a barrier 32 part of solder mask 28 thus preventing short circuiting among contiguous pads 24. The thickness of solder mask 28 is selected to be approximately equal to the thickness of the SSDs desired to cover each soldering pad 24.

Notice that the pocketed-PCB 20 must be utilized by this invention, as well as by the SIPAD™ and PPT™ processes, as the essential starting component for manufacturing SSD-PCBs. Notice that the concept of a pocketed-PCB is not limited to rigid substrates. Therefore, this invention is applicable to the production of SSDs on flexible circuits.

FIG. 4 depicts three alternative manners for supplying solder alloy to a pocketed-PCB 20 prior to reflow, they are; (1) discrete solder paste printing, (2) lump solder paste printing and (3) dry solder powder fill.

Discrete Paste Printing (DPP) consists of individually filling each pockets 30 with a precisely metered solder paste volume 34. This operation becomes a real challenge when pads 24 exhibit ultra-fine pitch spacing (say around 0.3 mm). The DPP manner of supplying solder alloy to a pocketed-PCB 20 is a requirement for the SIPAD™ process which cannot accept other alternatives. DPP is the most costly of the three possible manners and, therefore, its utilization represents a disadvantage. Notice that, the DDP manner of supplying solder alloy can be utilized by both the PPT™ process and by this invention.

Lump Paste Printing (LPP), shown in the center of FIG. 4, is a relatively unprecise, and thus economical, process that simultaneously over-fills a group of adjacent pockets 30 with a solder paste lump 36. In essence such solder paste lump 36 temporarily short circuits a plurality of pads 24 laying under it.

LPP utilizes a stencil whose apertures are very large in comparison to the ones required by the stencil used by DPP. Such coarse stencil is cheap to manufacture, prevents clogging, needs less cleaning and allows to use a coarser solder paste. Notice that the LPP manner of supplying solder to a pocketed-PCB 20 can be utilized by both the PPT™ process and by this invention.

Dry Solder Powder Fill (DSPF), shown in the right side of FIG. 4, is a novel alternative (not yet utilized by the electronics industry) by which a solder powder pile 38 fills each pocket 30. This manner of supplying solder alloy to a pocketed-PCB 20 prior to reflow is the most economical one because dry solder powder is much cheaper than solder paste and secondly the costly paste printing equipment is not employed. To produce said solder powder piles 38, solder powder can be spread over and across a pocketed-PCB 20 with a squeegee or individually supplied to each pocket 30 with a powder dispenser device. Notice that the DSPF cannot be utilized by neither the SIPAD™ process nor the PPT™ process.

Now that the three alternative manners of supplying solder alloy to a pocketed-PCB 20 prior to reflow has been presented, the specific reflow approach utilized by the SIPAD™ process, the PPT™ process and by this invention shall be discussed in detail aided by FIG. 5 through FIG. 8.

FIG. 5 presents the reflow mode utilized by the SIPAD™ process depicting a portion of a pocketed-PCB 20 previously supplied with solder paste volumes 34 via DPP. The reflow is performed into a conventional conveyorized reflow oven that subjects the complete pocketed-PCB 20 to simultaneous heat transfer from above and below.

During such particular heating cycle, that may last from one to three minutes, the entire pocketed-PCB 20 is uniformly heated to the reflow temperature, a level generally ranging from 200 to 250 degrees Celsius (depending on the solder alloy utilized). After the solder paste contained on each pocket 30 melts it is allowed to solidify forming meniscus shaped SSDs 40. Subsequently the meniscus needs to be flattened or planarized in order for them to be acceptable for components placement. This flattening operation imposes undesirable mechanical stress to the SSD-PCB, a disadvantage of the SIPAD™ process.

FIG. 6 presents the reflow mode utilized by the PPT™ process depicting a portion of a pocketed-PCB 20 previously supplied with solder paste either via DPP (solder paste volumes 34) or via LPP (solder paste lumps 36). The pocketed-PCB 20 is first covered with a fine mesh 42 that is brought in direct contact with the solder paste and solder mask 28 upper surface. Thereafter, heat is transferred into the upper side of mesh 42 by an impinging stream of hot air inside a reflow oven specifically designed for this process.

After a heating cycle lasting about fifteen seconds the paste contained on each pocket 30 melts. The molten solder fills each pocket 30 while any excess solder is drawn up by mesh 42 by way of a wicking effect that causes the excess solder to emerge on the top face of mesh 42. Before this excess solder solidifies it is scraped away from mesh 42 top surface by scraping means not shown in FIG. 6.

While I believe that the wicking effect (that draws excess molten solder from the upper side of pocketed-PCB 20 onto the top surface of mesh 42) is a phenomenon that occurs because of a complex interactive combination of surface tension prevailing on molten solder, inability of molten solder to wet mesh 42, temperature gradient between molten solder and mesh 42 and buoyancy forces induced by the molten solder, I don't wish to be bound by this.

Notice that any amount of solder paste deposited on top of barriers 32 by the LPP manner may appear to result in short circuiting adjacent pads 24. However, any molten solder on top of barriers 32 is sideward drawn into pockets 30 and any resulting excess is also drawn up by mesh 42 emerging on the top face of mesh 42 from where it is scraped away.

Therefore, thanks to the wicking action effected by mesh 42 around barriers 32 it is possible to successfully utilize the relatively unprecise, and thus economical, LPP approach (see FIG. 4 center sketch) without causing bridging among adjacent pads 24.

The solder contained on each pocket 30 while remaining under mesh 42 solidify forming flat-shaped SSD 44 whose upper surface is relatively flat but it is characterized by an embossed texture that replicates a mesh 42 imprint.

The PPT™ process, unlike the SIPAD™ process, does not require planarization of the SSD thus sparing the finished SSD-PCB from mechanical stress. In addition, notice that its heating cycle is relatively mild when compared to the SIPAD™ process. Because the pocketed-PCB 20 is heated from one side only during about fifteen seconds, a much shorter time than the SIPAD™ process, the back side of pocketed-PCB 20 remains at a lower temperature than the reflow level.

FIG. 7 presents the first of the two reflow modes utilized by this invention. The figure depicts a portion of a pocketed-PCB 20 previously supplied with solder either via DPP (solder paste volumes 34) or via LPP (solder paste lumps 36). The pocketed-PCB 20 is covered with a wire mesh 42 in direct contact with both the solder paste and the solder mask 28 upper surface.

An electric current of adequate intensity temporarily flowing throughout wire mesh 42 heats it up to a predetermined level, consequently heat is transferred from hot wire mesh 42 into the solder paste contained into pockets 30 first causing evaporation of solvent and flux contained into solder paste and finally causing melting of the solder alloy. The molten solder fills each pocket 30 while any excess solder is drawn up by mesh 42 by way of the wicking action described above (see paragraph [0048]) thus causing the excess solder to emerge on the top face of wire mesh 42. Before this excess solder solidifies it is scraped away from wire mesh 42 top surface by scraping means not shown in FIG. 7. The solder contained on each pocket 30 while remaining under mesh 42, solidify forming flat-shaped SSDs 44 whose upper surface is relatively flat and it is characterized by an embossed texture that replicates a wire mesh 42 imprint.

Notice that the above disclosed reflow mode is indeed a novel one because, unlike the PPT™ process, this invention does not require a reflow oven. The heat is generated by wire mesh 42 itself, thus the reflow can be readily achieved on an open-air environment similarly as it is done when hand soldering with an electric soldering iron. Therefore, it could be alleged that wire mesh 42 by itself performs as a planar soldering tool.

Unlike the SIPAD™ process, here it does not require planarization of the flat-shaped SSDs 44 thus eliminating that manufacturing step while sparing the finished SSD-PCB from mechanical stress. In addition, notice that since the heating cycle lasts about five seconds it is even milder than for the PPT™ process (about three times shorter). As a result less heat reaches substrate 22 back side.

FIG. 8 presents the second reflow mode utilized by this invention. The figure depicts a portion of a pocketed-PCB 20 previously supplied with dry solder powder piles 38 that fill each pocket 30. The pocketed-PCB 20 is covered with a wire mesh 42 in direct contact with the solder powder and the solder mask 28 upper surface. Mesh 42 is impregnated with a multiplicity of flux lumps 46, one flux lump 46 on every area located above a pocket 30 filled with a solder powder pile 38. As an option, flux lumps 46 could cover an area above a group of pockets 30 (as show in FIG. 8) or even the complete mesh could be impregnated with flux.

An electric current of adequate intensity temporarily flowing throughout wire mesh 42 heats it up to a predetermined level, causing flux lumps 46 to liquefy. The hot liquid flux flows down into each pocket 30 mixing with the solder powder piles 38 and transfering some initial heat. Heat continues to be transferred from mesh 42 into the solder powder piles 38 causing them to melt.

Notice that without the presence of said hot liquid flux the solder powder would oxidize during heating. Oxidation would impede the coalescence of molten solder particle into a uniform mass and also would prevents metallurgically bonding with pads 24.

After the flux evaporates away, the molten solder powder fills each pocket 30 while any excess solder is drawn up by mesh 42 by way of wicking action causing the excess solder to emerge on the top face of mesh 42. Before this excess solder solidifies it is scraped away form mesh 42 top surface by scraping means not shown in FIG. 8. The solder contained on each pocket 30, while remaining under mesh 42, solidify forming a flat-shaped SSD 44 whose upper surface is relatively flat and characterized by an embossed texture that replicates a mesh 42 imprint.

Again, notice that the reflow mode disclosed in FIG. 8 is indeed a novel one because, unlike the PPT™ process, this invention does not require a reflow oven. The heat is generated by mesh 42 itself thus the reflow can be readily achieved on an open-air environment.

Unlike the SIPAD™ process, here it is not requires planarization of the flat-shaped SSDs 44 thus eliminating that manufacturing step while sparing the finished SSD-PCB from mechanical stress. In addition, notice that since the heating cycle last about five seconds it is even milder than for the PPT™ process (about three times shorter) as result less heat reaches substrate 22 back side.

The reflow mode disclosed by FIG. 8 perhaps represents the most desirable approach for manufacturing SSD-PCB because in addition of not requiring a reflow oven it also permits to eliminate the paste printing equipment, indeed the most costly apparatus required by the SIPAD™ process.

Furthermore, use of dry solder powder instead of solder paste translates into enormous savings. For example, there is no need to formulate solder powder into solder paste, a costly and complex procedure aimed at attaining an adequate balance between chemical and rheological properties of a solder paste. Other savings are realized because in the case of FIG. 8, the acceptable solder powder particle size is much larger than the size required to formulate a solder paste satisfactory for printing (DPP or LPP) as needed in the cases of FIG. 5 through FIG. 7. In addition, since in the case of FIG. 8 it is not required that the solder powder particles be of quasi-spherical shape, as solder paste demands, a significant saving is realized.

The preceding comparative review of the possible manners for supplying solder to a pocketed-PCB 20 prior to reflow (see FIG. 4) and of the alternatives for reflowing a pocketed-PCB 20 according to this invention and according to the SIPAD™ and PPT™ processes (see FIG. 5 through FIG. 8), clearly indicates that this invention discloses novel, non-obvious and useful information that permits to advance the state-of-the-art in SSD-PCB technology.

Although, not illustrated in FIG. 4 through FIG. 8, it should be understood that the process described above is equally applicable: (a) to form SSDs on solder rings used for through-hole mount devices and (b) for filling via holes with solid solder.

The use of either the SIPAD™ or the PPT™ process is not applicable to double-sided surface mount boards that require to be reflow-solder twice, i.e. boards with large (or relatively heavy) surface mount components placed on both sides. During the first reflow all the SSDs on the opposite side remelt loosing their planarity and thus becoming unusable for components placement. Only in the particular case when small (or relatively light) surface mount components are placed on the bottom side supported by glue, both sides can be reflow-solder in one operation.

However, this limitation can be overcome using this invention. First, SSDs are formed only on one side of the double-sided PCB then components are placed on that side and reflow-soldered. Subsequently the board is flipped over and SSDs are formed on the opposite side utilizing a lower melting temperature solder. Finally components are placed on said opposite side and reflow-soldered.

DESCRIPTION OF INVENTION IN PREFERRED EMBODIMENT

Referring now specifically to the entirety of my invention, a simple embodiment of my invention intended for batch manufacture of SSD-PCB is shown in FIG. 9 illustrated in accordance with the objectives of my invention by comprising a pocketed-PCB 20 (itself comprising a multiplicity of upward facing pockets 30 each filled with a predetermined amount of solder paste previously deposited via DPP or LPP), a mesh assembly 48 (itself comprising a tightened wire mesh 50, a pair of mesh end anchors 52—52 and a pair of link rods 54—54), a workholder 56 where pocketed-PCB 20 and mesh assembly 48 are both resting and clamped down by clamping means not shown in the figure such as that said mesh 50 is pressing down against the pocketed-PCB 20 upper face, means not shown to supply a predetermined electric current to mesh 50 via both mesh end anchors 52—52, means not shown to induce vibration onto said workholder 56, an enclosure chamber 58 that permits to contain vapors and/or gases generated during operation that may cause occupational health hazards and/or safety risks, means not shown to remove, in an environmentally safe manner, said vapor and/or gases, and controllable inlet means 60 and outlet means 62 for supplying a process gas (such as Nitrogen, Argon, etc.) to said enclosure chamber 58.

tightened wire mesh 50 is made of an electrical conductor material that is not wettable by molten solder. This is a requirement that assures the wicking action of tighten mesh 50 described above, see paragraph [0048]. Mesh end anchors 52—52 must be electric conductors. Link rods 54—54 as well as workholder 56 must be made of dielectric material.

tightened wire mesh 52 should have a sufficiently fine spacing between its interwoven wire strands while leaving adequate opening between the wire strands in order to facilitate said wicking action on molten solder. The mesh pitch should also be small enough to create a suitable texture imprint on the exposed face of each flat-shaped SSD 44. The proper mesh count ultimately must be determined empirically by trial-and-error depending on the particular application.

Notice that in FIG. 9, to avoid clutter, tightened wire mesh 50 is depicted as a much coarser mesh count than actuality.

In operation, a predetermined electric current is supplied throughout tightened wire mesh 50 via both mesh end anchors 52—52. The current heats up mesh 50 to a predetermined temperature higher than the temperature at which the solder paste contained inside cavities 30 melts. Once all solder is molten the electric current is interrupted.

Concurrently, while mesh 52 is being electrically heated, workholder 54 is shaken or made to vibrate under the action of vibration inducing means not shown in FIG. 9. The vibration of workholder 54 is transmitted to the molten solder alloy promoting venting from cavities 30 of any entrapped gas or vapor resulting from the heating of the solder paste. Such venting produces void-free flat-shaped SSDs 44. The vibration, in addition, enhances the wicking effect induced by mesh 50 thus assuring that all excess molten solder alloy migrates to the upper surface of mesh 50.

At this point of the operation all cavities 30 are filled with molten solder and all excess solder is accumulated on top of mesh 50. While this excess solder is still in liquidus phase it is removed away from the top of mesh 50 (by scraping means not shown in FIG. 9) leaving pocketed-PCB 20 free from excess solder.

Subsequently mesh 52 is allowed to cool either naturally or by a forced flow of ambient air (not shown in the figure) impinging on its upper surface. As mesh 52 cools, the molten solder filling cavities 30 starts to solidify. Now mesh assembly 48 is removed from the top of pocketed-PCB 20 exposing a finished SSD-PCB.

Thereafter, the finished SSD-PCB is swept clean of any loose solder particle and/or flux residues by scrubbing or brushing and/or washing its upper face. Notice that, unlike the case of the SIPAD™ process, there is no need for flattening the flat-shaped SSD 44 upper surface therefore they are ready to accept placement of electronic components after application of a tacky flux coating.

Electromagnetic induction heating can be applied for fast heating tightened wire mesh 50 without departing from the spirit and scope of this invention.

A second embodiment of my invention intended for batch manufacture of SSD-PCB utilizing dry solder powder instead of solder paste is shown in FIG. 10 illustrated in accordance with the objectives of my invention by comprising a pocketed-PCB 20 (itself comprising a multiplicity of upward facing pockets 30 each filled with a solder powder pile 38), a mesh assembly 48 (itself comprising a tightened wire mesh 50, a pair of mesh end anchors 52—52 and a pair of link rods 54—54), a workholder 56 where pocketed-PCB 20 and mesh assembly 48 are both resting and clamped down by means not shown in the figure such as that said mesh 50 is pressing down mesh 50 against pocketed-PCB 20 upper face, means not shown to supply a predetermined electric current to mesh 50 via both mesh end anchors 52—52, means not shown to induce vibration onto said workholder 56, an enclosure chamber 58 that permits to contain vapors and/or gases generated during operation that may cause occupational health hazards and/or safety risks, means not shown to remove in an environmentally safe manner said vapor and/or gases, controllable inlet means 60 and outlet means 62 for supplying a process gas (such as Nitrogen, Argon, etc.) to said enclosure chamber 58 and a stencil not shown in the figure.

In operation, said stencil is placed on top of mesh 50 in proper alignment with pocketed-PCB 20 utilizing alignment (or registration) means not shown in the figure. The alignment guarantees that above each and every pocket 30 (or group of adjacent pockets 30) exists a predetermined aperture on said stencil. A flux volume (not sown in the figure) is swept across the entire stencil top surface with a doctor blade (not sown in the figure). Then said stencil is lifted leaving a predetermined number of flux deposits 64 on top of tightened wire mesh 50.

Subsequently, a predetermined electric current is supplied to both mesh end anchors 52—52, the current heats up mesh 50 to a predetermined temperature higher than the temperature at which the dry solder powder contained inside cavities 30 melts.

Heated tightened wire mesh 50 causes the flux deposits 64 to liquefy. As a consequence the hot liquid-flux flows down into each pocket 30 mixing with the solder powder piles 38 transferring initial heat. Heat continues to be transferred from wire mesh 50 into the liquid-flux/solder-powder mix causing flux evaporation and solder melting. Once all solder is molten the electric current is interrupted.

Without the presence of said hot liquid flux the solder powder would oxidize during heating. Oxidation would impede the coalescence of molten solder particle into a uniform mass and also would prevent metallurgically bonding with pads 24.

At this point in time all cavities 30 are filled with molten solder and all excess solder and flux residues were drawn up to the top of wire mesh 50 by wicking action. While this excess solder is still in liquidus phase, it is removed away from the top of wire mesh 50 (by scraping means not shown in FIG. 10) leaving pocketed-PCB 20 free from excess solder and/or flux residues.

Subsequently wire mesh 50 is allowed to cool down either naturally or by a forced flow of ambient air impinging on its upper surface. As wire mesh 50 cools down the molten solder filling cavities 30 starts to solidify. Now mesh assembly 48 is removed from the top of pocketed-PCB 20 exposing a finished SSD-PCB.

Thereafter, the finished SSD-PCB is swept clean of any loose solder particle and flux residues by scrubbing or brushing and/or washing its upper face. Notice that, unlike the case of the SIPAD™ process, there is no need for flattening the upper surface of flat-shaped SSDs 44 upper surface therefore they are ready to accept placement of electronic components after application of a tacky flux coating.

A third embodiment of my invention intended for conveyorized manufacture of SSD-PCB is shown in FIG. 11 illustrated in accordance with the objectives of my invention by comprising a twin-conveyor system 66 itself comprising a conveyor belt 68, a driver drum 70, a driven drum 72, a set of idle rollers 74, a conveyor wire mesh 76, a driver spool 78, a driven spool 80, means not shown for causing belt 68 and wire mesh 76 to move at the same tangential speed, a pair of mesh electrodes 82—82 capable of being lowered and then retracted, means not shown to supply an electric current to electrodes 82—82, a vibration inducer 84, a fumes hood chamber 86 that permits to contain vapors and/or gases generated during operation that may cause occupational health hazards and/or safety risks, means not shown to remove in an environmentally safe manner said vapor and/or gases, a controllable inlet/outlet means 88 for supplying a process gas (such as Nitrogen or Argon) to said enclosure chamber 86, mesh scraping means 90, mesh cooling means 92, a mesh cleaning device 94, a board capture station 96, a reflow station 98, a solder removal station 100, a mesh cooling station 102 and a board ejection station 104.

In operation a pocketed-PCB 20 (itself comprising a multiplicity of upward facing pockets 30 each filled with a predetermined amount of solder paste previously supplied via DPP or LPP) is grabbed at board capture station 96 by conveyor belt 68 and conveyor wire mesh 76 (entrapped in a sandwiched fashion) since both said conveyors form a narrow moving passage 106. Once pocketed-PCB 20 arrives at reflow station 98, located under fumes hood chamber 86, belt 68 and mesh 76 both stop. Immediately, the pair of mesh electrodes 82—82 is lowered until contacting and pressing down wire mesh 76 against pocketed-PCB 20. Then a predetermined electric current is supplied to electrodes 82—82, the current heats up the portion of mesh 76 covering pocketed-PCB 20 (the area stretched between electrodes 82—82) to a predetermined temperature higher than the temperature at which the solder paste contained inside cavities 30 melts.

The portion of conveyor wire mesh 76 that is not contacting pocketed-PCB 20 (specifically the one stretching between and wrapping over driver spool 78 and driven spool 80) undergoes insignificant heating because it conforms a parallel electrical circuit of much higher resistance than the portion stretched between electrodes 82—82. Once all solder is molten the electric current is interrupted and mesh electrodes 82—82 are lifted to permit free translation of conveyor wire mesh 76.

Concurrently, while conveyor wire mesh 76 is being heated, set of idle rollers 74 are shaken or made to vibrate under the action of vibration inducer 84, the vibration generated on conveyor belt 68 is transmitted to the molten solder alloy causing the venting from cavities 30 of any entrapped gas or vapor emanating from the heating of the solder paste thus producing void-free flat-shaped SSDs 44. The shaking action, in addition, enhances the wicking effect induced by wire mesh 76 thus assuring that all excess molten solder alloy migrates to the upper surface of wire mesh 76.

At this point in time when all cavities 30 are filled with molten solder and all excess solder is accumulated on top of conveyor wire mesh 76 the pocketed-PCB 20 is transported by moving passage 106 to solder removal station 100. While the excess solder is still in liquidus phase it is removed away from the top of conveyor mesh 76 by mesh scraping means 90 leaving pocketed-PCB 20 free from excess solder.

Following, the pocketed-PCB 20 is transported again by moving passage 106 to mesh cooling station 102 where mesh 76 is allowed to cool either naturally or by a mesh cooling means 92 that could supply cold air impinging on its upper surface. As mesh 76 cools down the molten solder filling cavities 30 start to solidify. Finally, belt 68 and mesh 76 move again releasing a finished SSD-PCB at the board ejection station 104 where narrow moving passage 106 ends.

During continuous operation while a fresh pocketed-PCB 20 enters the twin-conveyor system 66 at the board capture station 96, a finished SSD-PCB emerges at the board ejection station 104. During a full cycle the twin-conveyor system 66 executes four translations of equal length separated by four periods of repose of equal duration. During continuous operation four pocketed-PCB 20 are entrapped into narrow moving passage 106.

Conveyor mesh 76 is made of an electrical conductor material that should not be wetable by molten solder and should have a sufficiently fine spacing between its interwoven wires strands while leaving adequate opening between its wire strands in order to facilitate wicking action on molten solder, see paragraph [0048]. The mesh pitch should also be small enough to create a suitable texture imprint on the exposed face of each resulting flat-shaped SSD 44. Conveyor belt 68 is made of a dielectric material.

The complete cycle can be reduced to three translations without altering the results by combining excess solder removal and wire mesh cooling stations into a single station.

Conveyor mesh 76 retains some solidified solder and flux residues (mainly inside its wire strand openings). After ejecting a finished SSD-PCB and wrapping over driver spool 78, wire mesh 76, if needed, can be cleaned while traversing through mesh cleaning device 94.

At reflow station 98 electromagnetic induction heating can be applied for fast heating the portion of conveyor wire mesh 76 contacting pocketed-PCB 20 without departing from the spirit and scope of this invention. In such a case there is no need for twin-conveyor system 66 to sequentially translate and stop. It can run continuously because pair of electrodes 82—82 are not utilized. Mesh 76 is heated by electromagnetic induction means while traversing throughout reflow station 98.

A fourth embodiment of my invention intended for conveyorized manufacture of SSD-PCB utilizing dry solder powder instead of solder paste is shown in FIG. 22 illustrated in accordance with the objectives of my invention by comprising the same elements recited above for the case of FIG. 11 and in addition comprising a flux stencil 108, a flux supply volume 110, a doctor blade 112 and a flux printing station 114.

In operation a pocketed-PCB 20 (itself comprising a multiplicity of upward facing pockets 30 each filled with a dry solder powder pile 38) is captured at board capture station 96 by conveyor belt 68 and conveyor wire mesh 76 (entrapped in a sandwiched fashion) at board capture station 96 since both said conveyors form a narrow moving passage 106. Once pocketed-PCB 20 arrives at flux printing station 114 belt 68 and mesh 76 both stop.

Immediately, flux stencil 108 is placed on top of mesh 76 in proper alignment with pocketed-PCB 20 utilizing alignment (or registration) means not shown in the figure. The alignment guarantees that above each pocket 30 (or group of adjacent pockets 30) exist a predetermined aperture on flux stencil 108. A flux supply volume 108 is swept across stencil 108 with a doctor blade 112. Then flux stencil 108 is lifted leaving a predetermined multiplicity of flux layers 116 on top of wire mesh 76.

Following, the pocketed-PCB 20 is transported by belt 68 and mesh 76 to reflow station 98 where the pair of mesh electrodes 82—82 is lowered until contacting with mesh 76 that is pressed down against pocketed-PCB 20. Then a predetermined electric current is supplied to electrodes 82—82, the current heats up the portion of mesh 76 covering pocketed-PCB 20 (the area stretched between electrodes 82—82) to a predetermined temperature higher than the temperature at which the solder powder piles 38 contained inside cavities 30 melt. First the flux layers 116 located on top of wire mesh 76 liquefy and as a consequence the hot liquid flux flows down into each pocket 30 mixing with the dry solder powder piles 38 transferring some initial heat. Heat continues to be transferred from mesh 76 into the liquid-flux/solder-powder mix causing flux evaporation and solder melting. Once all solder is molten the electrical current is interrupted and mesh electrodes 82—82 are lifted.

Concurrently, while conveyor mesh 76 is being heated, set of idle rollers 74 are shaken or made to vibrate under the action of vibration inducer 84, the vibration generated on conveyor belt 68 is transmitted to the liquid-flux/solder-powder mix causing the venting from cavities 30 of any entrapped gas or vapor emanating from the heating of the flux thus producing void-free flat-shaped SSDs 44. The shaking action, in addition, enhances the wicking effect induced by mesh 76 thus assuring that all excess molten solder alloy migrates to the upper surface of wire mesh 76.

At this point in time when all cavities 30 are filled with molten solder and all excess solder is accumulated on top of conveyor mesh 76 the pocketed-PCB 20 is transported by belt 68 and mesh 76 to solder removal station 100. While the excess solder is still in liquidus phase it is removed away from the top of conveyor mesh 76 by mesh scraping means 90 leaving pocketed-PCB 20 free from excess solder.

Following, the pocketed-PCB 20 is transported by belt 68 and mesh 76 to mesh cooling station 102 where mesh 76 is allowed to cool down either naturally or by mesh cooling means 92 that could supply cold air impinging on its upper surface. As wire mesh 76 cools the molten solder filling cavities 30 starts to solidify. Finally, belt 68 and mesh 76 move again releasing a finished SSD-PCB at the board ejection station 104 where narrow moving passage 106 ends.

Conveyor mesh 76 may retain some solidified solder and flux residues (mainly inside its wire strand openings). After ejecting a finished SSD-PCB and wrapping over driver spool 78 the wire mesh 76, if needed, can be cleaned while traversing through mesh cleaning device 94.

During continuous operation while a fresh pocketed-PCB 20 enters the twin-conveyor system 66 at the board capture station 96 a completed SSD-PCB emerges at the board ejection station 104. During a full cycle the twin-conveyor system 66 executes five translations of equal length separated by five periods of repose of equal duration.

The complete cycle can be reduced to four translations without altering the results by combining excess solder removal and wire mesh cooling stations into a single station.

Notice that in the appended claims the term—upper span—refers to the portion of conveyor belt 68 stretching between driver drum 70 and driven drum 72 that is in contact with set of idle rollers 74 and, that the term—lower span—refers to the portion of conveyor wire mesh 76 stretching between driver spool 78 and driven spool 80 that is placed to run contiguous to said upper span.

SUMMARY, RAMIFICATIONS, AND SCOPE OF INVENTION

Accordingly, the reader should discern that this invention is a truly innovative one that provides the electronic packaging industry with a new, safe, reliable and more economical process and apparatus for manufacturing SSD-PCBs than the prior art. The resulting SSD-PCB is suitable for soldering surface-mount and straddle-mount type devices.

Since my apparatus and process do not require a reflow oven as the prior art does, but instead employs an electrically heated wire mesh that delivers fast transient heating, the utilization of my invention offers the following advantages when compared to the prior art:

- permits to manufacture SSD-PCBs utilizing a reflow heating cycle about thirty times faster than the SIPAD™ commercial process and at least three times faster than the PPT™ commercial process thus and so sparing the PCB from the harsh reflow process that prior art imposes,
- reduces energy consumption by about fifty times with respect to the SIPAD™ process and about five times with respect to the PPT™ process,
- is able to utilize dry solder powder instead of solder paste,
- reduces the cost of capital investment because unlike the prior art, paste printing equipment and reflow oven are not needed to fabricate SSD-PCBs,
- reduces the required manufacturing floor space, and
- reduces the overall cost of manufacturing SSD-PCBs.

Although the above description contains many specificities, these should not be construed as limiting the scope of the invention but as merely providing illustrations of some of the presently preferred embodiments of this invention. Any compositions or methods which are functionally equivalent are within the scope of this invention. Indeed, from the forgoing description, various other variations and structural changes will become apparent to those skilled in the art without departing from the spirit and scope of this invention. As an example see paragraph [0097].

The process and apparatus disclosed can readily be applied to other application not related to electronic assembly or packaging. Such as applications requiring precise miniaturized soldering and/or brazing operations. Furthermore, the solder paste or the solder powder can be replaced by brazing alloy paste or brazing alloy powder as long as it is utilized in conjunction with a suitable brazing mask that tolerates the higher temperature that brazing requires.

Accordingly, the scope of this invention should be determined by the appended claims and their legal equivalents, rather than by the embodiment illustrated.

I claim:

1. A batch process for manufacturing SSD-PCB in an open-air environment utilizing solder paste that employs as heat source an electrically heated fine wire mesh, comprising the steps of:
   (a) supplying a pocketed-PCB itself comprising a solder mask having embedded a multiplicity of pockets exposing a multiplicity of soldering pads on a side facing upward, and
   (b) depositing a predetermined amount of solder paste inside each of said multiplicity of pockets, and
   (c) placing a fine wire mesh in contact with said side facing upward, and
   (d) supplying a predetermined electric current to said fine wire mesh consequently heating said fine wire mesh to a predetermined temperature for a predetermined time sufficiently long to cause melting of said predetermined amount of solder paste deposited inside each of said multiplicity of pockets consequently filling said multiplicity of pockets with a multiplicity of molten solder volumes, and
   (e) removing from the top surface of said fine wire mesh any excess molten solder that was drawn upward by wicking action induced by said fine wire mesh, and
   (f) allowing said fine wire mesh to cool down causing solidification of said multiplicity of molten solder volumes consequently forming individual flat-shaped SSDs each metalurgically bonded to one of said multiplicity of soldering pads, and
   (g) detaching said fine wire mesh from said side facing upward
whereby a finished SSD-PCB is obtained.

2. The process of claim 1, further comprising the step of:
   (h) shaking said pocketed-PCB during step (d)
whereby enhancing said wicking action induced by said fine wire mesh.

3. The process of claim 2, further comprising the step of:
   (i) performing step (d) inside an enclosure chamber
whereby containing inside said enclosure chamber gases or vapors generated during operation that may cause occupational health hazards and/or safety risks.

4. The process of claim 3, further comprising the step of:
   j) scrubbing or brushing and/or washing said finished SSD-PCB
whereby obtaining a clean SSD-PCB ready for final inspection.

5. A batch process for manufacturing SSD-PCB in an open-air environment utilizing dry solder powder that employs as heat source an electrically heated fine wire mesh, comprising the steps of:
   (a) supplying a pocketed-PCB itself comprising a solder mask having embedded a multiplicity of pockets exposing a multiplicity of soldering pads on a side facing upward, and
   (b) filling with a solder powder pile each of said multiplicity of pockets, and
   (c) placing a fine wire mesh in contact with said side facing upward, and
   (d) placing a flux stencil on top of said fine wire mesh in proper alignment with said pocketed-PCB, and
   (e) printing a predetermined number of flux deposits on top of said fine wire mesh, and
   (f) removing said flux stencil from the top of said fine wire mesh, and
   (g) supplying a predetermined electric current to said fine wire mesh consequently heating said fine wire mesh to a predetermined temperature for a predetermined time sufficiently long to liquefy said predetermined number of flux deposits to cause flux dripping through said fine wire mesh into each of said solder powder piles and then to cause melting of each of said solder powder piles consequently filling said multiplicity of pockets with a multiplicity of molten solder volumes, and
   (h) removing from the top surface of said fine wire mesh any excess molten solder that was drawn upward by wicking action induced by said fine wire mesh, and (i) allowing said fine wire mesh to cool down causing solidification of said multiplicity of molten solder volumes consequently forming individual flat-shaped SSDs each metalurgically bonded to one of said multiplicity of soldering pads, and (j) detaching said fine wire mesh from said side facing upward whereby a finished SSD-PCB is obtained.

6. The process of claim 5, further comprising the step of:

(k) shaking said pocketed-PCB during step (g)

whereby enhancing said wicking action induced by said fine wire mesh.

7. The process of claim 6, further comprising the step of:

(l) performing step (g) inside an enclosure chamber whereby containing inside said enclosure chamber gases or vapors generated during operation that may cause occupational health hazards and/or safety risks.

8. The process of claim 7, further comprising the step of:

(m) scrubbing or brushing and/or washing said finished SSD-PCB whereby obtaining a clean SSD-PCB ready for final inspection.

9. A conveyorized process for manufacturing SSD-PCB that employs as heat source an electrically heated conveyor wire mesh, comprising the steps of:

(a) supplying a pocketed-PCB itself comprising a solder mask having embedded a multiplicity of pockets exposing a multiplicity of soldering pads on a side facing upward, and (b) depositing a predetermined amount of solder paste inside each of said multiplicity of pockets, and (c) feeding said pocketed-PCB at the board capture station of a running twin-conveyor system consequently entrapping said pocketed-PCB inside a narrow moving passage that is delimited by a conveyor belt and a conveyor wire mesh both forming part of said twin-conveyor system such as that said side facing upward is contacting said conveyor wire mesh, and (d) transporting via said narrow moving passage said entrapped pocketed-PCB until it reaches a reflow station, and (e) supplying a predetermined electric current to the portion of said conveyor wire mesh in contact with said side facing upward consequently heating said portion of said conveyor wire mesh to a predetermined temperature for a predetermined time sufficiently long enough to cause melting of said predetermined amount of solder paste inside each of said multiplicity of pockets therefore filling said multiplicity of pockets with a multiplicity of molten solder volumes, and (f) transporting via said narrow moving passage said entrapped pocketed-PCB until it reaches a solder removal station, and (g) removing from the top surface of said portion of conveyor wire mesh in contact with said side facing upward any excess molten solder that was drawn up by wicking action induced by said portion of conveyor wire mesh in contact with said side facing upward, and (h) transporting via said narrow moving passage said entrapped pocketed-PCB until it reaches a mesh cooling station, and (i) allowing said portion of conveyor wire mesh in contact with said side facing upward to cool down causing solidification of said multiplicity of molten solder volumes consequently forming individual flat-shaped SSDs each metalurgically bonded to one of said multiplicity of soldering pads, and (j) transporting via said narrow moving passage said entrapped pocketed-PCB until it reaches a board ejection station causing its release from said narrow moving passage whereby a finished SSD-PCB is obtained.

10. The process of claim 9, further comprising the step of:

(k) shaking said entrapped pocketed-PCB during step (e)

whereby enhancing said wicking action induced by said portion of conveyor wire mesh in contact with said side facing upward.

11. The process of claim 10, further comprising the step of:

(l) performing steps (e) inside a fumes hood whereby containing inside said fumes hood gases or vapors generated during operation that may cause occupational health hazards and/or safety risks.

12. The process of claim 11, further comprising the step of:

(m) scrubbing or brushing and/or washing said finished SSD-PCB whereby obtaining a clean SSD-PCB ready for final inspection.

13. A conveyorized process for manufacturing SSD-PCB utilizing dry solder powder instead of solder paste that employs as heat source an electrically heated conveyor wire mesh, comprising the steps of:

(a) supplying a pocketed-PCB itself comprising a solder mask having embedded a multiplicity of pockets exposing a multiplicity of soldering pads on a side facing upward, and (b) filling with a solder powder pile each of said multiplicity of pockets, and (c) feeding said pocketed-PCB at the board capture station of a running twin-conveyor system consequently entrapping said pocketed-PCB inside a narrow moving passage that is delimited by a conveyor belt and a conveyor wire mesh both forming part of said twin-conveyor system such as that said side facing upward is in contact with said conveyor wire mesh, and d) transporting via said narrow moving passage said entrapped pocketed-PCB until it reaches a flux printing station, and (e) printing at said flux printing station a predetermined number of flux layers on top of said conveyor wire mesh, and (f) transporting via said narrow moving passage said entrapped pocketed-PCB until it reaches a reflow station, and (g) supplying a predetermined electric current to the portion of said conveyor wire mesh in contact with said side facing upward consequently heating said portion of said conveyor wire mesh to a predetermined temperature for a predetermined time sufficiently long enough to liquefy said predetermined number of flux layers and then to cause melting of said solder powder piles consequently filling said multiplicity of pockets with a multiplicity of molten solder volumes, and (h) transporting via said narrow moving passage said entrapped pocketed-PCB until it reaches a solder removal station, and (i) removing from the top surface of said portion of conveyor wire mesh in contact with said side facing upward any excess molten solder that was drawn up by wicking action induced by said conveyor wire mesh in contact with said side facing upward, and (j) transporting via said narrow moving passage said entrapped pocketed-PCB until it reaches a mesh cooling station, and (k) allowing said portion of conveyor wire mesh in contact with said side facing upward to cool down causing solidification of said multiplicity of molten solder volumes consequently forming individual flat-shaped SSDs each metalurgically bonded to one of said multiplicity of soldering pads, and (l) transporting via said narrow moving passage said entrapped pocketed-PCB until it reaches a board ejection station causing its release from said narrow moving passage whereby a finished SSD-PCB is obtained.

14. The process of claim 13, further comprising the step of:

(m) shaking said entrapped pocketed-PCB during step (g)

whereby enhancing said wicking action induced by said portion of conveyor wire mesh in contact with said side facing upward.

15. The process of claim 14, further comprising the step of:

(n) performing steps (g) inside a fumes hood whereby containing inside said fumes hood gases or vapors generated during operation that may cause occupational health hazards and/or safety risks.

16. The process of claim 15, further comprising the step of:

(o) scrubbing or brushing and/or washing said finished SSD-PCB whereby obtaining a clean SSD-PCB ready for final inspection.

17. An apparatus primarily intended for manufacturing SSD-PCB in a batch mode that employs as heat source an electrically heated fine wire mesh, comprising:

(a) a pocketed-PCB resting and clamped on top of a workholder, said pocketed-PCB itself comprising a solder mask having embedded a multiplicity of pockets on a side facing upward, a predetermined amount of solder paste deposited inside each of said multiplicity of pockets, and (b) a mesh assembly, said mesh assembly itself comprising a tightened wire mesh, a pair of mesh end anchors and a pair of link rods, said tightened wire mesh contacting with said side facing upward, and (c) means to supply a predetermined electric current to said pair of mesh end anchors thereby electrically heating said tightened wire mesh to a predetermined temperature for a predetermined time sufficiently long enough to cause melting of said predetermined amount of solder paste inside each of said multiplicity of pockets consequently filling said multiplicity of pockets with a multiplicity of molten solder volumes, and (d) means to scrape from the top of said tightened wire mesh any excess molten solder that was drawn up by wicking action induced by said tightened wire mesh, and (e) means to detach and remove said mesh assembly from said side facing upward after said multiplicity of molten solder volumes have solidified thereby forming a multiplicity of flat-shaped SSD whereby in operation a finished SSD-PCB is obtained.

18. The apparatus of claim 17, further comprising:

(f) means to shake said workholder whereby the inclusion permits to induce vibrations into said multiplicity of molten solder volumes enhancing the wicking action induced by said tightened wire mesh.

19. The apparatus of claim 18, further comprising:

(g) an enclosure chamber whereby the inclusion permits to contain gases or vapors generated during operation that may cause occupational health hazards and/or safety risks.

20. An apparatus primarily intended for manufacturing SSD-PCB in a batch mode utilizing dry solder powder instead of solder paste that employs as heat source an electrically heated fine wire mesh, comprising:

(a) a pocketed-PCB resting and clamped on top of a workholder, said pocketed-PCB itself comprising a solder mask having embedded a multiplicity of pockets on a side facing upward, a multiplicity of solder powder piles each filling one of said multiplicity of pockets, and (b) a mesh assembly, said mesh assembly itself comprising a tightened wire mesh, a pair of mesh end anchors and a pair of link rods, said tightened wire mesh contacting with said side facing upward, and (c) means to deposit a predetermined number of flux deposits on top of said tightened wire mesh, and (d) means to supply a predetermined electric current to said pair of mesh end anchors thereby electrically heating said tightened wire mesh to a predetermined temperature for a predetermined time sufficiently long enough to liquefy said predetermined number of flux deposits and then to cause melting of each of said solder powder piles consequently filling said multiplicity of pockets with a multiplicity of molten solder volumes, and (e) means to scrape from the top of said tightened wire mesh any excess molten solder that was drawn up by wicking action induced by said tightened wire mesh, and (f) means to detach and remove said mesh assembly from the side facing upward after said multiplicity of molten solder volumes have solidified thereby forming a multiplicity of flat-shaped SSD whereby in operation a finished SSD-PCB is obtained.

21. The apparatus of claim 20, further comprising:

(g) means to shake said workholder whereby the inclusion permit to induce vibrations into said multiplicity of molten solder volumes enhancing the wicking action induced by said tightened wire mesh.

22. The apparatus of claim 21, further comprising:

(h) an enclosure chamber whereby the inclusion permits to contain gases or vapors generated during operation that may cause occupational health hazards and/or safety risks.

23. An apparatus primarily intended for manufacturing SSD-PCB in a conveyorized mode employing as heat source an electrically heated conveyor wire mesh, comprising:

(a) a twin-conveyor system, said twin-conveyor system itself comprising a conveyor belt placed under a conveyor wire mesh such as that the upper span of said conveyor belt is placed parallel and contiguous to the lower span of said conveyor wire mesh forming a narrow moving passage of relatively constant height, and (b) means to simultaneously motorize said conveyor belt and said conveyor wire mesh such as that both move at the same tangential speed, both move and stop at the same time during an operational cycle that consists of four equal translations of said narrow moving passage separated by four periods of repose of equal duration sequentially defining a board capture station, a reflow station, a solder removal station, a mesh cooling station and a board ejection station, and (c) a pocketed-PCB that is captured at said board capture station by said narrow moving passage and transported to said reflow station, said pocketed-PCB itself comprising a solder mask having embedded a multiplicity of pockets on a side facing upward, a predetermined amount of solder paste deposited inside each of said multiplicity of pockets, and (d) a pair of wire mesh electrodes located at said reflow station capable of been lowered down for contacting and pressing down on the top side of said lower span of said conveyor wire mesh, and (e) means to supply a predetermined electrical current to said pair of wire mesh electrodes thereby electrically heating the portion of said lower span stretching between said pair of wire mesh electrodes to a predetermined temperature for a predetermined time sufficiently long enough to cause melting of said predetermined amount of solder paste inside each of said multiplicity of pockets consequently filling said multiplicity of pockets with a multiplicity of molten solder volumes, and (f) means at said solder removal station to scrape from the top side of said lower span any excess molten solder that was drawn up by wicking action induced by said conveyor wire mesh, and (g) means at said mesh cooling station to promote cooling of said portion of said lower span previously heated by said predetermined electrical current thus initiating solidification of said multiplicity of molten solder volumes consequently forming a multiplicity of flat-shaped SSDs whereby in operation a finished SSD-PCB is emerging at said board ejection station.

24. The apparatus of claim 23, further comprising:

(h) a vibration inducer to shake said upper span of said horizontal conveyor belt at said reflow station whereby the inclusion permit to generate vibrations into said multiplicity of molten solder volumes enhancing the wicking action induced by said lower span.

25. The apparatus of claim 24, further comprising:

(i) a fumes hood at said reflow station whereby the inclusion permits to contain gases or vapors generated during operation that may cause occupational health hazards and/or safety risks.

26. An apparatus primarily intended for manufacturing SSD-PCB in a conveyorized mode employing dry solder powder instead of solder paste employing as heat source an electrically heated conveyor wire mesh, comprising:

(a) a twin-conveyor system, said twin-conveyor system itself comprising a conveyor belt placed under a conveyor wire mesh such as that the upper span of said conveyor belt is placed parallel and contiguous to the lower span of said conveyor wire mesh forming a narrow moving passage of relatively constant height, and (b) means to simultaneously motorize said conveyor belt and said conveyor wire mesh such as that both move at the same tangential speed, both move and stop at the same time during an operational cycle that consists of five equal translations of said narrow moving passage separated by five periods of repose of equal duration sequentially defining a board capture station, a flux printing station, a reflow station, a solder removal station, a mesh cooling station and a board ejection station, and (c) a pocketed-PCB that is captured at said board capture station by said narrow moving passage and transported to said flux printing station, said pocketed-PCB itself comprising a solder mask having embedded a multiplicity of pockets on a side facing upward, a solder powder pile filling each of said multiplicity of pockets, and (d) a flux stencil temporarily placed at said flux printing station on the top side of said lower span properly aligned with said pocketed-PCB, and (e) means to print through said flux stencil a predetermined number of flux layers on the top side of said lower span, and (f) a pair of wire mesh electrodes located at said reflow station capable of being lowered down for contacting and pressing down on the top side of said lower span, and (g) means to supply a predetermined electrical current to said pair of wire mesh electrodes thereby electrically heating the portion of said lower span stretching between said pair of wire mesh electrodes to a predetermined temperature for a predetermined time sufficiently long enough to cause liquefaction of said predetermined number of flux layers and then to cause melting of said solder powder piles consequently filling said multiplicity of pockets with a multiplicity of molten solder volumes, and (h) means at said solder removal station to scrape from the top of the lower span of said conveyor wire mesh any excess molten solder that was drawn up by wicking action induced by said lower span, and (i) means at said mesh cooling station to promote cooling of said portion of said lower span previously heated by said predetermined electrical current thus initiating solidification of said multiplicity of molten solder volumes consequently forming a multiplicity of flat-shaped SSDs whereby in operation a finished SSD-PCB is ejected at said board ejection station.

27. The apparatus of claim 26, further comprising:

(j) a vibration inducer to shake said upper span of said horizontal conveyor belt at said reflow station whereby the inclusion permits to generate vibrations into said multiplicity of molten solder volumes enhancing the wicking action induced by said lower span.

28. The apparatus of claim 27, further comprising:

(k) a fumes hood at said reflow station whereby the inclusion permits to contain gases or vapors generated during operation that may cause occupational health hazards and/or safety risks.

* * * * *